(12) United States Patent
Chanussot et al.

(10) Patent No.: US 7,492,626 B2
(45) Date of Patent: Feb. 17, 2009

(54) MEMORY DEVICE WITH ACCESS CONTROLLER

(75) Inventors: Christophe Chanussot, Antibes (FR);
Vincent Gouin, Mandelieu (FR)

(73) Assignee: Infineon Technologies AG, Munich (DE)

( * ) Notice: Subject to any disclaimer, the term of this patent is extended or adjusted under 35 U.S.C. 154(b) by 245 days.

(21) Appl. No.: 11/462,697

(22) Filed: Aug. 4, 2006

(65) Prior Publication Data

US 2007/0030722 A1    Feb. 8, 2007

(30) Foreign Application Priority Data

Aug. 5, 2005    (EP) .................................. 05017135

(51) Int. Cl.
*G11C 11/00* (2006.01)
(52) U.S. Cl. .................. 365/154; 365/189.04; 365/200; 365/210.15; 365/192
(58) Field of Classification Search ................. 365/154, 365/189.04, 200, 210.15, 192
See application file for complete search history.

(56) References Cited

U.S. PATENT DOCUMENTS

| 6,252,814 | B1 | 6/2001 | Tran et al. | |
|---|---|---|---|---|
| 6,549,452 | B1 | 4/2003 | Park | |
| 6,738,283 | B2 * | 5/2004 | Kasai et al. | 365/154 |
| 7,120,761 | B2 | 10/2006 | Matsuzaki et al. | |
| 2003/0193824 | A1 * | 10/2003 | Tsukikawa et al. | 365/149 |
| 2003/0202412 | A1 * | 10/2003 | Nii et al. | 365/210 |
| 2005/0128807 | A1 | 6/2005 | Chen et al. | |
| 2006/0023555 | A1 * | 2/2006 | Morishima | 365/230.03 |

FOREIGN PATENT DOCUMENTS

KR    1020020050092    6/2002

OTHER PUBLICATIONS

European Patent Office Extended Search Report and Search Opinion dated Jan. 23, 2006.

* cited by examiner

*Primary Examiner*—Thong Q Le
(74) *Attorney, Agent, or Firm*—Patterson & Sheridan, L.L.P.

(57) ABSTRACT

A memory comprises a bitline, an accessible memory element, an activable switch coupled between the bitline and the access node and a controller configured to activate the activable switch within a first activation period, to activate the activable switch within a second activation period and to deactivate the activable switch at least once when accessing to the accessible memory element during the same access operation.

22 Claims, 10 Drawing Sheets

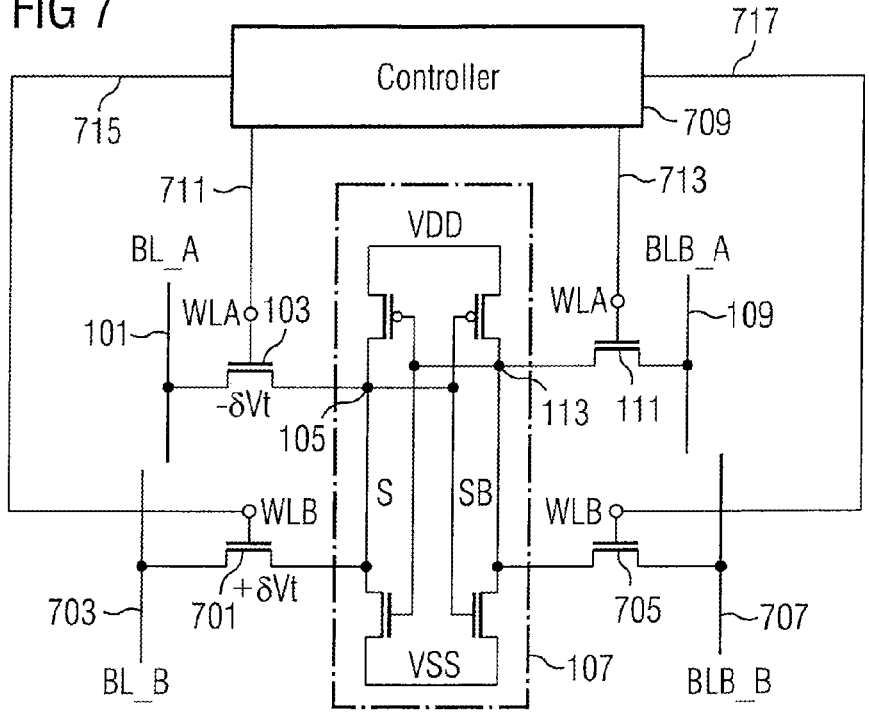
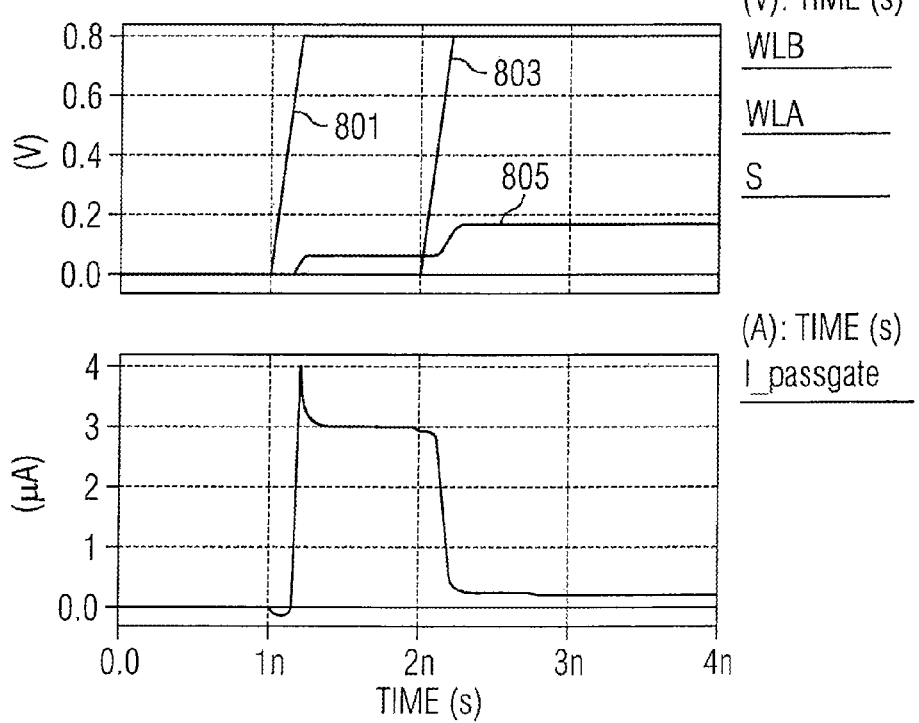

------- conventional

FIG 11
CONT=1: continuous WL
CONT=0: discontinuous WL
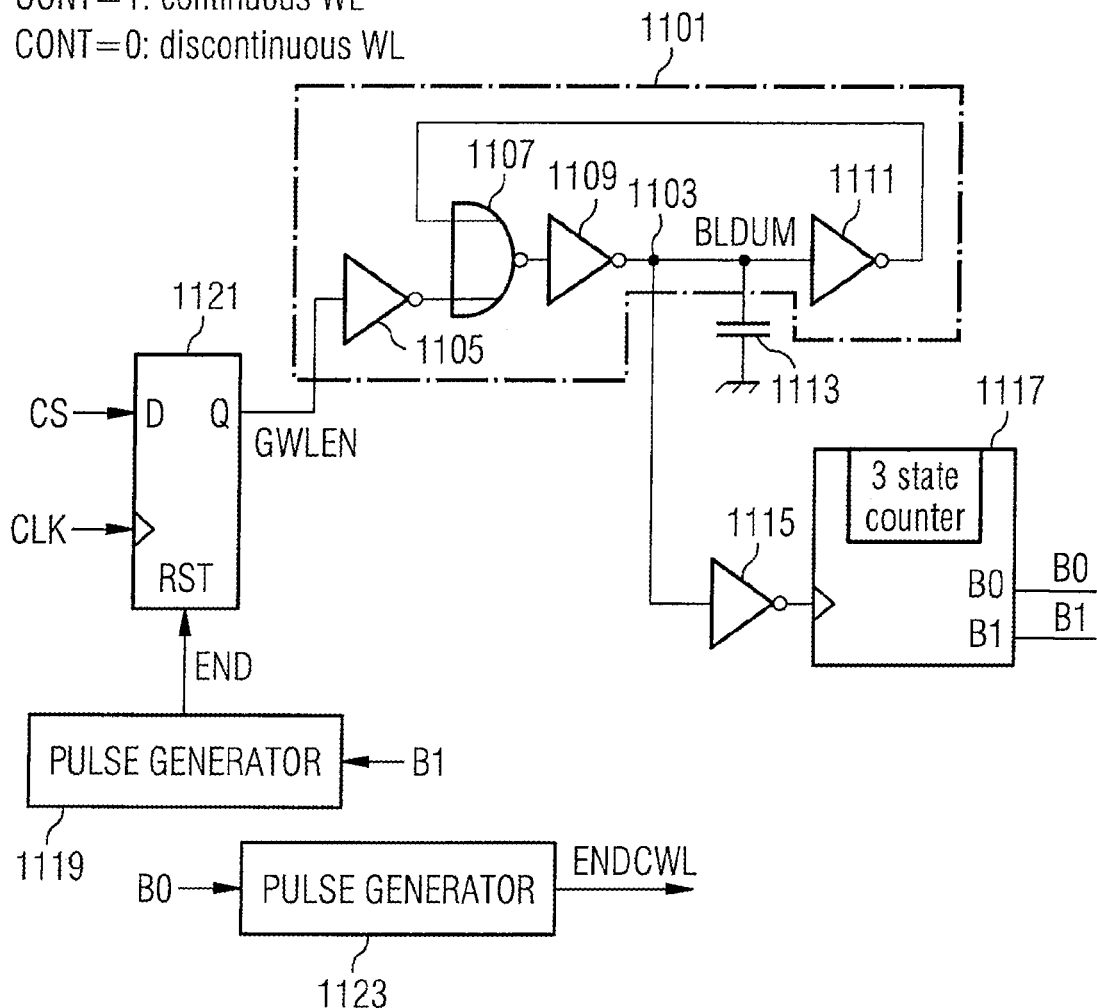
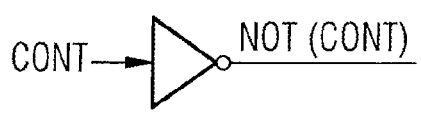
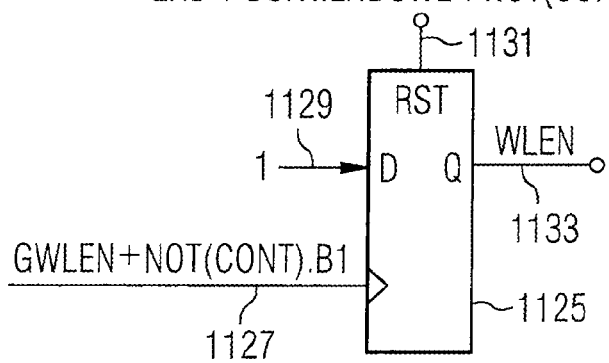

MEMORY DEVICE WITH ACCESS CONTROLLER

CROSS-REFERENCE TO RELATED APPLICATIONS

This application claims foreign priority benefits under 35 U.S.C. §119 to co-pending European patent application number EP 05 017 135.4, filed 4 Aug. 2005. This related patent application is herein incorporated by reference in its entirety.

BACKGROUND OF THE INVENTION

1. Field of the Invention

The invention relates to memory cells, in particular to volatile memory cells.

2. Description of the Related Art

When accessing a memory cell, an electric potential (hereinafter, potential) representing stored information may be superimposed by an additional potential caused by e.g. an accessing device. Thus, the potential representing the stored information may change, which may result in cell instability and, subsequently, in a loss of information, in particular when the memory cell comprises latches for storing information bits. Due to local process variations, an instability of e.g. SRAM (static random access memory) cells is a major factor reducing the yield for memory blocks at low voltage. The process variations further affect the writeability of a memory cell and its read current (for instance twice less yield loss, both cumulated). Thus, a possibility of instability of the cell reduces the access reliability.

In order to prevent cell instability and to increase access reliability, a dynamic VDD switching of the cell supply may be performed. During an access operation, e.g. during a read operation, the VDD at the memory cell is higher than a periphery VDD, whereas during a write operation the VDD at a selected column of the memory cell is switched back to the regular VDD in order to enable the write operation.

However, dynamic VDD switching of the cell supply suffers from the disadvantage that a further voltage supply is necessary in order to provide different VDD voltages.

The change of the potential representing the stored information may also occur when several devices simultaneously access the memory element for e.g. while reading out information from the memory element (dual access). Moreover, one of the access devices may prevent another access device from simultaneously accessing the memory cell due to e.g. an additional voltage (potential) caused by the access device. Therefore, the access reliability is reduced. Generally, two kinds of behaviors can then be distinguished. In the case of an instability, the stored value tends to be corrupted. In the case of a read unreliability, an access transistor suffers from the change of the potential of the storing node and the current or charge it is able to deliver to the bitline is reduced, which results in a degradation of read reliability since sensing margins are degraded.

Multi-port SRAM memories, especially Dual-Port SRAM memories, are however often employed in chip designs. The most risky operation occurs when, during e.g. a dual read operation, row addresses of memory elements are identical for both ports A and B at which the memory device is accessed via e.g. bitlines and wordlines WLA and WLB. In this case, both wordlines (WLA and WLB) of the same bit cell row are simultaneously selected. The reliability of a double read operation is degraded, especially at low voltage (e.g. 0.7 volt) for deep submicron technologies, especially if a threshold voltage is high when compared with the low voltage.

In order to increase the access reliability during a dual access operation, the memory cells may be changed which is associated with increased costs. Furthermore, the simultaneous access can be avoided by allowing an access device to access the memory element after another access device has completed the access operation. This results in an increased total assess time and reduced flexibility.

Since the known methods provide different solutions to increasing the access reliability for different access scenarios, different solutions have to be implemented for single and dual access operations which is associated with an increased complexity and with a reduced flexibility.

SUMMARY OF THE INVENTION

The object of the present invention is to provide a common concept for reliably accessing a memory cell in different access scenarios.

One embodiment of the invention provides a memory cell comprising a bitline and an accessible memory element, e.g. an SRAM element, for storing information. The accessible memory element comprises an access node for accessing the accessible memory element for e.g. reading the stored information. The bitline is coupled to the access node of the accessible memory element via an activable switch which may be configured to connect the bitline to the access node when activated (i.e. if the activable switch is switched on) or to disconnect the bitline from the access node when deactivated (i.e. if the activable switch is switched off).

The memory cell further comprises a controller configured to activate the activable switch for accessing the memory element during an access operation. According to one embodiment of the invention, the controller is configured to interrupt the access operation at least once during the same access operation. More specifically, the controller may be configured to activate the activable switch within a first activation period, activate the activable switch within a second activation period, and deactivate the activable switch at least once when accessing the accessible memory element during the same access operation.

Embodiments of the invention are based on the finding that the access reliability can be increased when interrupting the access operation at least once while accessing the memory cell.

According to one embodiment of the invention, the controller may be configured to activate the activable switch within a first activation period, to activate the activable switch within a second activation period, and to deactivate the activable switch at least once when accessing the accessible memory element during the same access operation. In other words, the single access operation may, at least once, be interrupted while accessing the memory element.

For example, the period of inactivity (deactivation period, interrupt) may be significantly shorter than the periods of activity during which the memory cell is accessed to during the access operation. Therefore, a change of the potential resulting when accessing to the memory cell during an activation period which may be shorter than a conventional access period may be reversed. Therefore, a significant change of the potential causing the instability of the cell is prevented. In other words, the cell undergoes a recovery process during the deactivation period. Surprisingly, an access current, e.g. a read current provided by the cell is not significantly reduced so that the detectability of the stored information is not negatively affected.

Embodiments of the invention exploit a difference in speed of two phenomena, namely the cell instability and the cell recovery. It has been found that the cell instability is a slow phenomenon occurring especially at low voltage (e.g. 0.7 volt) because the nodes are driven by conflicting currents where e.g. a pass gate which is activated while accessing the memory cell and a pull-down transistor or where NMOS/ PMOS inverter are in conflict (slow positive feedback loop). These currents are low (slightly driving the transistors due to a low gate overdrive). On the other hand, the cell recovery resulting when e.g. a wordline is switched off (e.g. when the pass gate is deactivated) is comparatively fast since strong currents without conflicts are involved. For example, in one embodiment, cell instability may take 6 ns while the cell recovery may take 0.2 ns. Thus, a deactivation period of 0.2 to 0.3 ns is sufficient to stabilize the cell during the access operation. Correspondingly, an activation period, during which e.g. cell content is actively accessed, may preferably not exceed 6 ns, in the previous embodiment, in order to prevent cell instability, by way of example.

According to one embodiment of the invention, the access operation is e.g. a single read operation during which an information bit stored in the memory element is sensed. In other words, the access operation is the operation during which the memory element is accessed for e.g. reading the information bit during a single access cycle.

According to one embodiment, the deactivation period may be shorter than the first activation period or the second activation period. For example, the first or the second activation period and the deactivation period are in a ratio of 1:20 to 1:5, e.g. 1:10. The controller may be configured to divide the access operation into at least three phases, each phase being associated with a period of activation or deactivation. According to one embodiment, a duration of the first activation period and a duration of the second activation period may be equal. However, a duration of the first activation period and a duration of the second activation period may be different so that e.g. the second activation period following the deactivation period is shorter than a duration of the first activation period.

The same concept may be applied for increasing access reliability during a dual access to the memory cell (memory element). According to one embodiment of the invention, at least one deactivation period is introduced during a dual access operation. Thus, another access device may access the memory element during the deactivation period without conflicts for at least a period of time which is determined by the deactivation period.

According to one embodiment of the invention, the deactivation period may be equal to the first and to the second activation period. In this case, the controller may be configured for dividing the access operation into three equal phases, each phase being associated with a period of activation or deactivation. In this case, the deactivation period is sufficiently long in order to enable dual access to the memory cell (to the memory element) without conflicts.

Thus, the deactivation period contributes to increasing the access reliability since the memory cell may e.g. be stabilized during the access operation. For example, the information stored in the memory element is represented by a certain potential (e.g. 0 V, 0.7 volt, 3 V or 5 volt) at the access node. To read out the information, the controller may activate the switch so that the bitline is coupled to the access node which allows a transfer of the potential to the bitline. However, during the first activation period the certain potential may change due to a superposition of other potentials resulting from e.g. a threshold voltage of a transistor forming the switch. For example, the potential at the access node may rise during the access operation starting from e.g. 0 V. In order to prevent cell instability when the potential at the access node exceeds a threshold potential, e.g. 0.3 V or 0.5 V, the access operation is interrupted to enforce a recovery of the cell during which the potential stabilizes again at about 0 V. In order to interrupt the access operation, the switch deactivates the activable switch after the first activation period and keeps it deactivated during the deactivation period.

The deactivation period may be determined by a recovery time which is required by a potential at the access node to return to the certain potential, i.e. which is required for the potential at the access node to stabilize at about 0 V. For example, in one embodiment, the deactivation period may be in the range of 0.1 ns-0.5 ns. The first activation period in the exemplary embodiment may last for e.g. 1 ns-10 ns, e.g. 3 ns. For example, the second activation period being in the range of the first activation period may directly follow the first activation period. In this case, the first and the second activation periods are followed by the deactivation period in order to stabilize the cell.

However, the deactivation period may separate the first and the second activation period so that, when accessing the memory element during the first activation period, only a part (e.g. 30%-50%) of the certain potential (e.g. 0 V or 0.7 V), representing the stored information is transferred to the bitline. Subsequently, the deactivation period contributes to refreshing the certain potential. Subsequently, the second activation period is provided so that at least a part of the (refreshed) certain potential can be read out again.

In order to provide a sufficient number of activation periods for reliably accessing the memory element, the controller may be configured to activate the activable switch within a number of activation periods and to deactivate the activable switch within a further number of deactivation periods during the same access operation (the same access cycle), e.g. during the same read operation. For example, the further number of deactivation periods may be smaller than the number of activation periods so that one deactivation period separates two subsequent activation periods. However, the further number of deactivation periods and the number of activation periods may be equal. In this case, the activation period and the deactivation periods interlock, wherein a deactivation period separates two subsequent activation periods.

According to an aspect, the controller may be configured to determine the number of activation periods and/or the number of deactivation periods in dependency on the degradation of an access current (e.g. a read current) which is provided by the memory element during the access operation. The access current may depend on the certain potential at the access node. Thus, a change of the certain potential results in a change of the current.

For example, the controller may be configured to detect an amplitude of the access current and to compare the amplitude with a threshold, e.g. 70%, 80% or 90% the initial current. If an amplitude of the access current falls below the threshold during one activation period, then a deactivation period is provided in order to stabilize the cell. Conversely, the controller may be configured to introduce the activation period if the amplitude of the current exceeds the threshold.

In order to determine the duration of the access operation or in order to determine the number of activation periods, the controller may comprise a dummy bitline which is coupled via a capacitor to ground in order to e.g. emulate behavior of the memory element during an access operation. Thus, the controller may be configured to determine a discharge time of the dummy bitline by discharging the dummy bitline via the capacitor starting from the certain potential. Thus, a duration of an activation period may be determined in dependency on the discharge time, during which the potential at the dummy bitline falls to a predetermined fraction of the initial, certain potential. The controller may introduce a deactivation period in order to stabilize the memory element. Preferably, the bitline is then charged again.

However, the controller may be configured to determine the duration of the access operation comprising the number of activation periods in dependency on the discharge time. For example, during the access operation the number of activation periods and the further number of deactivation periods is provided. In order to ensure that the currently captured potential represents the certain potential, the controller may be configured for charging and discharging the dummy bitline according to the activation and deactivation period pattern, and to detect a current potential at the dummy bitline in order to determine whether the resulting potential approaches a first potential representing a first memory state (e.g. 0 V, certain potential) or the second memory state (e.g. 0.7 V, certain potential).

In order to determine the duration of the access operation, the controller may comprise, according to an aspect, a first timing circuit comprising e.g. the dummy bitline mentioned above or another dummy bitline coupled via a capacitor to ground. The first timing circuit may be configured to determine the duration of the access operation or the number of activation periods on a basis of a discharge rate of the capacitor or on a basis of the discharge time, as described above.

In order to determine the further number of deactivation periods, the controller may comprise a second timing circuit configured to determine the further number of deactivation periods. For example, the certain timing circuit may comprise a dummy bitline coupled via a capacitor to ground so that the second timing circuit determines the duration of a deactivation period and, correspondingly, the further number of the deactivation period based on a discharge rate or based on a discharge time of the capacitor, as described above. For example, the second timing circuit may be triggered by an output of the first timing circuit. Furthermore, the second timing circuit may determine a duration of the activation period.

According to one embodiment, the memory cell may comprise a further bitline and a further activable switch which is coupled between the further bitline and the access node of the memory element. Therefore, a simultaneous access to the memory element via the bitline and via the further bitline can be performed in order to e.g. read out the certain potential at the same access node.

The further activable switch may be configured to connect the further bitline to the access node when activated by the controller, and/or to disconnect the further bitline from the access node when deactivated.

The controller may further be configured to activate the further activable switch within a third activation period when accessing to the memory element during a further access operation, wherein the third activation period, during which the further switch is activated, at least partly overlaps the deactivation period of the switch so that a simultaneous access to the memory element via the same access node is, at least during the deactivation period, avoided.

The controller may further be configured to deactivate the further switch during a further deactivation period while accessing the memory element via the access node during the same access operation, e.g. during a read operation. The controller may be configured to deactivate the further switch during at least a part of the first or of the second activation period during which the switch is activated so that the further deactivation period of the further switch at least partly overlaps the first and/or the second activation period of the switch.

According to one embodiment, the first, the second and the third activation period may be equal. Furthermore, the deactivation period associated with the switch and the further deactivation period associated with the further switch may be equal. The activation periods and the deactivation periods may be in the range of time mentioned above. However, the first, second and third activation period, the deactivation period and the further deactivation period may be equal.

The third activation period may, however, be longer than the first and/or the second activation period. For example, the third activation period may be twice the first activation period or twice the second activation period.

According to one embodiment, the controller may be configured for simultaneously activating the switch and the further switch so that the memory element can simultaneously be accessed via the bitline and via the further bitline. Due to the deactivation period or due to the activation period, at least a period of time is provided during which a single access to the access node is performed.

The controller may further be configured to detect the further access operation by e.g. detecting a begin of the further access operation during which e.g. a read enable signal is present and to delay the further access operation so that the resulting timing patterns are timely shifted with respect to each other. For example, the controller may comprise a detector which is configured to detect the further access operation by e.g. detecting a read enable signal being e.g. applicable at the further switch and to output a detect signal indicating the begin of the further access operation. The controller may be configured to delay the further access, i.e. to delay activating the further switch in response to the detect signal. According to one embodiment, the detector may be configured to delay the further access operation. During delaying the access operation, e.g. the third activation period during which the further switch is actively activated may be delayed towards the deactivation period of the switch. For example, the delay may be in the range of 0 ns to 3 ns.

In order to determine the timely arrangement of the first, second and third activation period with respect to each other and in order to determine the timely arrangement of the deactivation periods, the controller may comprise a counter and a timing circuit comprising a dummy bitline and a capacitor coupled to ground. According to an embodiment of the invention, a duration of an output value provided by the counter may be determined by a discharge time of the capacitor, as described above. The timing circuit may be configured to receive the output value and to determine the first, second and/or third activation period and/or the deactivation period in response to the output value.

According to one embodiment, the memory cell may further comprise another activable switch coupled between another bitline and another access node of the memory element, wherein the other activable switch is configured to connect the other bitline to the other access node when activated, or to disconnect the other bitline from the other access node when deactivated. The inventive controller may be configured to simultaneously activate or to simultaneously deactivate the switch and the other switch for differentially accessing to the access node within the same access operation.

Accordingly, the memory cell may comprise yet another bitline and yet another switch so that the further access operation can also differentially be performed.

For example, the access memory element is a random access memory element (RAM) or a static random access memory element (SRAM).

It is an advantage of the inventive concept that instability related yield losses can significantly be reduced. Furthermore, the inventive concept can simply be implemented, since e.g. further voltage supply is not necessary. This reduces costs. Furthermore, an impact of the deactivation periods on e.g. a read current is small so that a small penalty on the read current is to be expected (e.g. 10%-15%). In addition, a cell writeability is not compromised since during the write operation e.g. a single and narrow wordline pulse can be applied. The inventive concept provides a recovery at about 100% of the low voltage instability fails is expected.

The memory control circuitry which may comprise the controller can easily be implemented by an update of the memory control circuit.

The inventive concept associated with preventing the simultaneous access is simple, since both ports may be kept independent. Therefore, a priority management between the ports is not necessary so that costs and control overhead is reduced. Moreover, the same configurable control may be used in both ports which further simplifies the control task. In addition, the access time is not impacted, because the memory element may simultaneously be accessed, since at least one deactivation period during the same access operation is provided. Moreover, an access time at the access node or at the further access node (e.g. port B) can be reduced since a sense amplifier can be enabled at the end of e.g. the deactivation period (phase P1).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 shows a memory cell according to an embodiment of the invention.

FIG. 8 shows a diagram of signals associated with the memory cell of FIG. 7.

FIG. 11 shows a controller according to an embodiment of the invention. and

DETAILED DESCRIPTION OF THE PREFERRED EMBODIMENT

Figure 1:
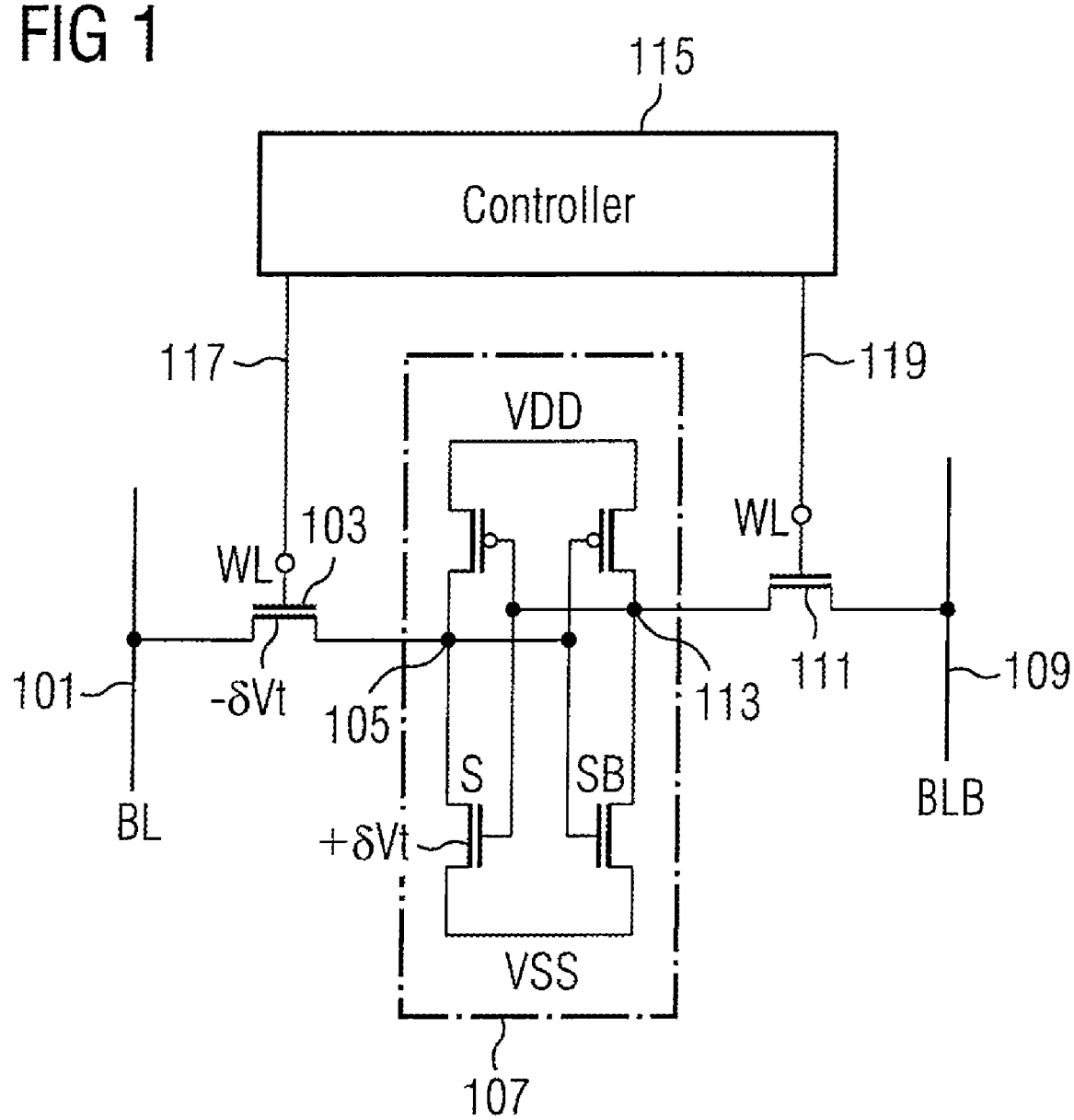
FIG. 1 shows a memory cell according to an embodiment of the invention.

The memory cell shown in FIG. 1 comprises a bitline 101 coupled via an activable switch 103 to an access node 105 of an accessible memory element 107. The memory cell further comprises another bitline 109 coupled via another switch 111 to another access node 113 of the accessible memory element 107.

The memory cell further comprises a controller 115 having a terminal 117 and a further terminal 119. The terminal 117 is coupled to a control terminal of the switch 103. The terminal 119 is coupled to a control terminal of the switch 111.

The accessible memory element 107 comprises two NMOS transistors and two PMOS transistors which are connected with each other and arranged within the accessible memory element 107 as shown in FIG. 1. The accessible memory element 107 may be, for example, an SRAM core cell or another RAM cell. The switch 103 and the switch 111 may be NMOS or PMOS transistors.

Referring to the memory cell shown in FIG. 1, local variations of a threshold voltage Vt are intrinsic to the process and depend, for example, on a gate area of the devices. When considering standard memories, a multiple of a standard deviation (sigma) should be taken into account which may be in the range of 5 to 6 sigma for several millions of bits on a chip.

The Vt mismatch combination depicted in FIG. 1 may affect a core cell instability since a strong access device accessing the accessible memory element 107 e.g. via the bitline 101 (BL) and the switch 103, which may be associated with a negative Vt variation $-\delta$Vt, and a weak pull-down device associated with e.g. a positive Vt variation $+\delta$Vt may change the potential at the access node 105 (node S) representing the content of the memory. For example, if a "0" is stored, the potential (certain potential) at the access node 105 representing the "0" may rise significantly when the wordline WL at the control port of the switch 103 is selected. The increased potential may cause the accessible memory element 107 to flip so that the stored information is lost (destructive reading).

The present invention, therefore, improves the cell functionality at e.g. low voltage (e.g. 0.7 volt) since the stability, the write-ability and the read current result from a compromise in terms of transistor dimension of SRAM cell. In particular, the invention dramatically improves cell stability when used inside a memory macro with a very low penalty on read current and without any penalty with respect to write-ability.

In particular, the cell instability is a slow phenomenon when compared with the cell recovery. For example, in one embodiment, cell instability may last around 6 ns, while cell recovery may take 0.2 ns. The chip in L90 technology show the slow cell instability phenomenon at e.g. low voltage. The cell instability depends e.g. on a wordline duration, especially when long wordline pulses (longer than 5 ns to 10 ns) are used.

Figure 2:
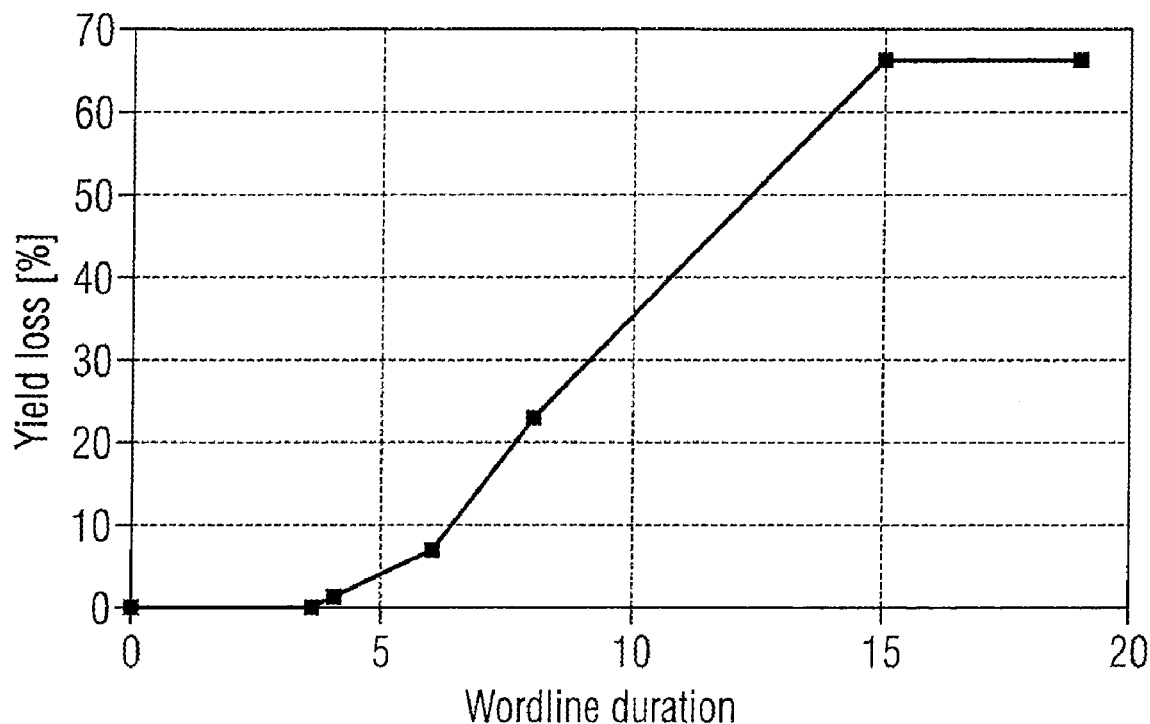
FIG. 2 demonstrates a stability related yield loss.

FIG. 2 shows the results of yield loss versus wordline signal duration which are obtained from simulations based on statistical transistor parameter fluctuations. The technology is, by way of example, 90 nm at 0.7 volt supply. In order to prevent cell instability, short recovery periods inside a local wordline pulse are inserted. The recoveries may occur at regular time intervals which are shorter than a majority of cell corruption times.

Referring again to FIG. 1, the information stored in the accessible memory element 107 may be accessed via the bitlines 101 (BL) and 109 (BLB) when simultaneously activating the switches 103 and 111. In order to activate switches 103 and 111, a wordline signal (WL) may be applied to the respective control terminals. During e.g. a read process, the potential at the access node 105 is transferred to the bitline 101 via the switch 103. Simultaneously, a complementary potential at the other access node 113 (SB) is transferred via the switch 111 to the bitline 109 (BLB). For example, if the potential at the access node 105 is VDD than the potential at the other access node 113 is VSS, or vice versa.

As mentioned above, due to fluctuations of the threshold voltages Vt, the stored potential at the node 105 may be superimposed by another potential resulting from a superposition of the threshold voltages depicted in FIG. 1. However, it has been found that the change of the potential which may result in cell instability is a process which is comparatively slow to a period that is necessary for the memory cell to recover. The recovery period is the period that is necessary for the potential to stabilize, i.e. to return to the initial potential representing the stored information.

In order to avoid the change of the potential at e.g. the node 105, and, correspondingly, at the node 113, recovery periods interrupting the access operation are provided in order to stabilize the potential between two subsequent pulses activating the switches 103 and 111 for transferring the potentials from the nodes 105 and 113 to the bitlines 101 and 109. The controller 115 may be configured to simultaneously activate the switches 103 and 111, e.g. pulse-wise, during the activation periods, each activation period being followed by a deactivation period during which the controller 115 preferably simultaneously deactivates the switches 103 and 111.

In order to introduce the recovery periods, the controller 115 may be configured to generate a pulsed sequence comprising a plurality of pulses, each pulse activating the switch 103 and being followed by a deactivation period. The pulsed sequence may be generated during one and the same access operation, e.g. during the same read operation which is performed to read the stored information during the same read cycle. The same pulsed sequences may simultaneously be applied to the control terminal of the switch 111.

As mentioned above, the switches 103 and 111 may be transistors, e.g. field effect transistors, so that the control terminals correspond to gate terminals of the transistors 103 and 111.

According to one embodiment of the invention, short recovery periods (deactivation periods) may be inserted inside a long wordline pulse, the duration of the wordline pulse determining the duration of the access operation. The recoveries may occur at regular time intervals which are shorter than the majority of cell corruption times.

Figure 3:
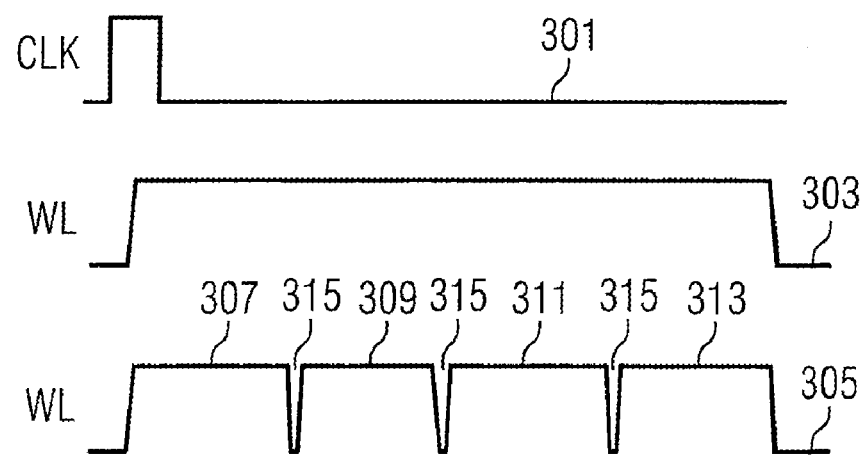
FIG. 3 shows waveforms with recovery periods, according to an embodiment of the invention.

FIG. 3 illustrates the inventive principle of the wordline pulses with recovery periods (deactivation periods) in comparison with a standard wordline pulse.

In response to a clock signal 301 (CLK), a conventional wordline pulse 303 (WL) may be generated. The duration of the wordline pulse 303 determines the duration of the access operation. As mentioned above, the wordline pulse 303 may be too long so that a change of the potential due to e.g. variations of threshold voltages may occur. Thus, an inventive wordline sequence 305 comprises a plurality of activation periods, e.g. a first activation period 307, a second activation period 309, a third activation period 311 and a fourth activation period 313, by the way of example. The inventive wordline sequence 305, which may be generated by the controller 115, further comprises a plurality of deactivation periods 315, each deactivation period separating two subsequent activation periods, e.g. the activation periods 307 and 309. The inventive wordline signal 305 may simultaneously be applied to the control gates of the switches 103 and 111, so that the switches are, pulse-wise, activated and, for a short period of time, e.g. 0.1 ns, 0.2 ns or 0.3 ns, deactivated. For example, the duration of the inventive wordline sequence 305 and the duration of the conventional wordline sequence 303 are equal. It has been found that a deterioration of e.g. a read current when introducing the deactivation period is small. The deterioration of the read current is related to the duty factor. Since the duty factor enabling the cell to stabilize is high, the current deterioration is low. Therefore, the content of the memory cell can reliably be accessed.

Moreover, the probability of an error is minimized since, during the deactivation periods, the potentials representing the content of the cell are stabilized. When compared to the conventional wordline pulse 303, the inventive wordline sequence 305 is discontinuous during the same access operation, e.g. during the same read operation.

Figure 4:
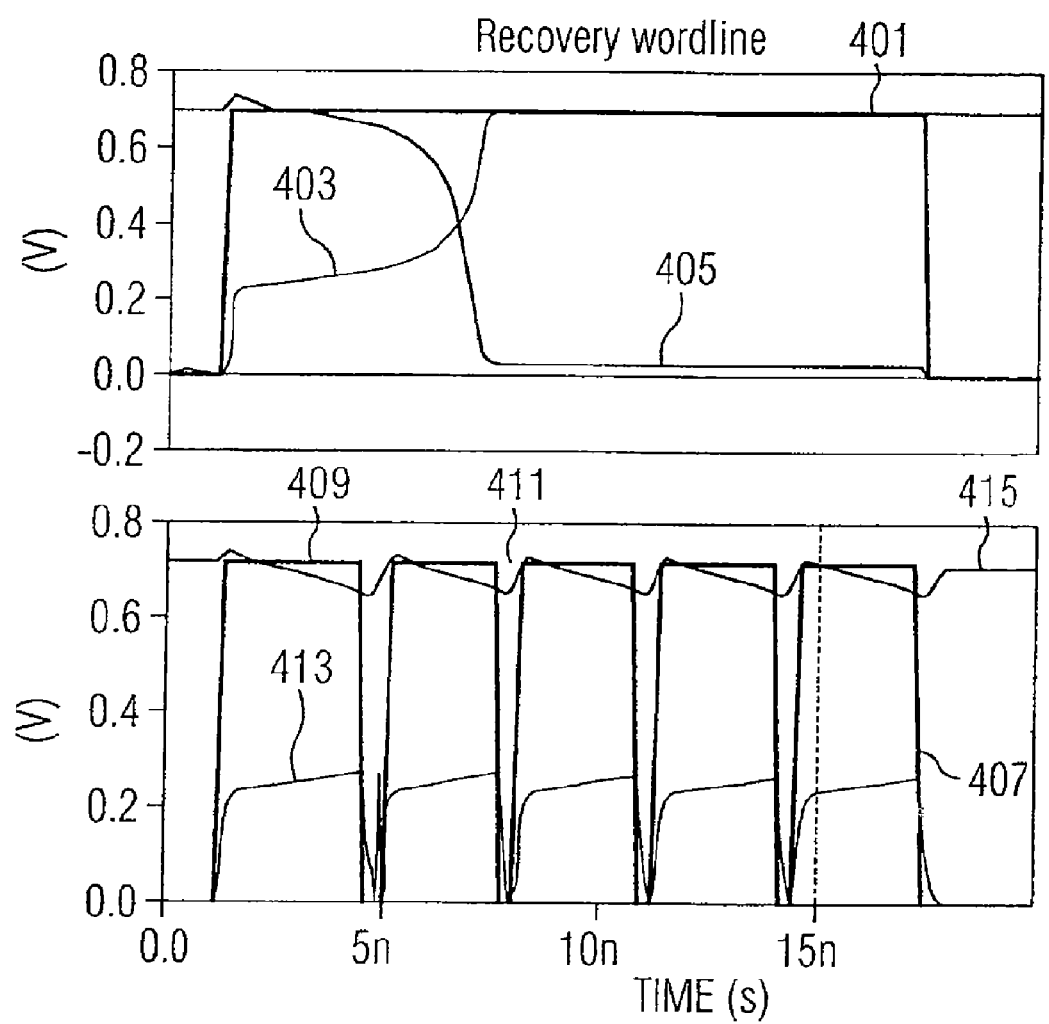
FIG. 4 shows a simulation example of voltages of a wordline signal with recovery, according to an embodiment of the invention.

FIG. 4 shows a simulation example of the inventive wordline activation approach with recovery and its impact on cell stability.

The upper diagram of FIG. 4 shows a conventional wordline sequence 401. For example, the content of the memory element shown in FIG. 1 is represented by initial potentials at the access node 105, which is represented by 0 V, and at the access node 113 being represented by 0.7 V (complementary potentials). When applying the conventional wordline signal 401 simultaneously to the switches 103 and 111, the potential at the access node 105 may change during the access operation, as indicated by the curve 403. Simultaneously, the potential at the other access node 113 changes as indicated by the curve 405. While accessing the accessible memory element using the conventional wordline signal 401, the cell may become instable which results in flipping of the potentials so that the potential at the node 105 becomes "high" and the potential at the node 113, which is complementary to the one at the node 105, becomes "low". In this case, the content of the memory cell is lost.

The lower diagram of FIG. 4 demonstrates the inventive concept. In order to avoid flipping of the potentials while accessing to the memory element, the controller 115 may be configured to generate a pulsed wordline sequence 407 comprising a plurality of activation periods 409 and a plurality of deactivation periods 411, a deactivation period separating two subsequent activation periods 409. For example, a potential at the access node 105 represented by the curve 413 may slightly change during one activation period 409. However, a significant rising of the potential at the node 105 is prevented since a deactivation period 411 following the activation period 409 enforces a stabilization of the potential. Thus, the potential at the node 105 may turn back to its initial state, as indicated by the falling portion of the curve 413 during the deactivation period. Correspondingly, the complementary potential at the node 113, which is represented by the curve 415, may fall during the activation period 409. However, the deactivation period 411 enforces the potential at the node 113 to rise again to its initial state. Therefore, the cell instability is dynamically prevented. In FIG. 4, WL denotes the conventional wordline sequence 401, S, represented by the curve 403, denotes a change of the potential at the access node 105 of FIG. 1, SB, represented by the curve 405, denotes the change of the potential at the node 113, WL_recov is the inventive wordline sequence being represented by the curve 407, S_recov is a variation of the potential at the node 105, which is represented by the curve 413, and SB_recov represents variation of the potential at the node 113, as indicated by the curve 415.

As shown in FIG. 4, a single activation period may be much larger relative to a single deactivating period. For example, in the embodiment illustrated in FIG. 4, a single activation period may be equal to e.g. 3 ns, wherein a single deactivation period may be equal to 0.1 ns, 0.2 ns, or 0.3 ns-0.4 ns.

Figure 5A:
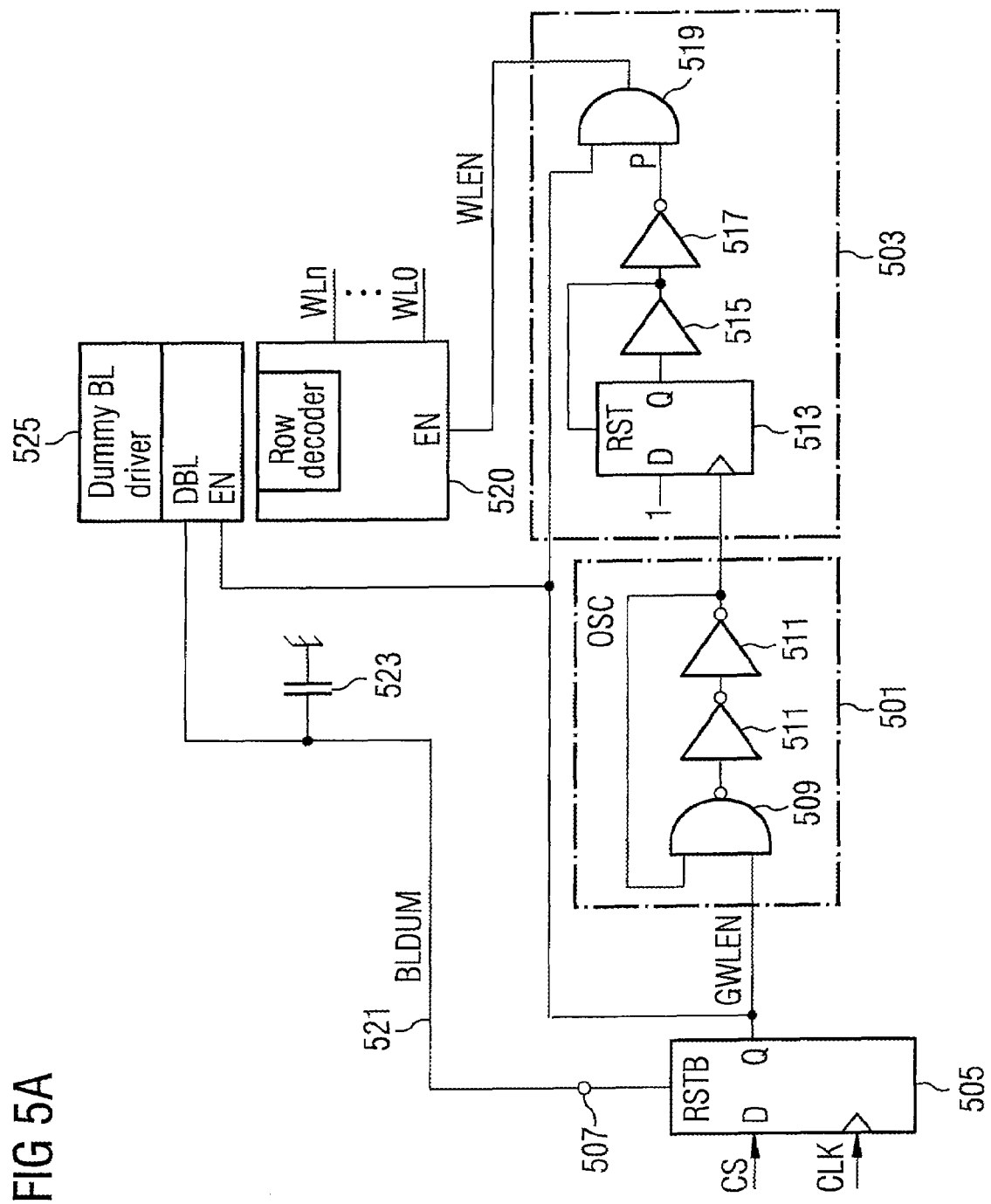
FIG. 5A shows a block diagram of a controller according to an embodiment of the invention.

FIG. 5A shows a controller according to a further embodiment of the present invention. The controller comprises a ring oscillator 501 having an input and an output, and pulse generator 503 having a first and a second input and an output. The controller further comprises a flip-flop 505 having an output coupled to the input of the ring oscillator 501 and a control input 507 (RSTB). The flip-flop 505 further comprises an input for receiving a control signal (CS) and a further input for receiving a clock signal (CLK).

The ring oscillator 501 may further comprise a gate 509 (e.g. a NAND-gate) which may be a CMOS gate. The ring oscillator 501 further comprises buffer elements 511 connected in series (e.g. inverter), wherein the output of the ring oscillator 501 is provided at an output of a last buffer element 511, which is coupled back to a first input of the gate 509. The gate 509 further comprises a second input connected to the output of the flip-flop 505.

The pulse generator 503 (which may be triggered on a rising input) may comprise a flip-flop 513, e.g. an RST flip-flop having a first input, a second input, a control input and an output. As shown in FIG. 5A, a constant signal represented by logic "1" may be applied to the first input, wherein the second input of the flip-flop 513 is connected to the output of the ring oscillator 501. The pulse generator 503 may further comprise a buffer 515 having an input, to which the output of the flip-flop 513 is coupled, and an output coupled to the control input of the flip-flop 513. The output of the buffer 515 is coupled to an input of a further buffer 517 (e.g. an inverter). The pulse generator 503 further comprises a gate 519, e.g. a CMOS AND gate having a first input, a second input and an output. The first input of the gate 519 is connected to the output of the flip-flop 505. The second input of the gate 509 is connected to the output of the buffer 517 of the pulse generator 503. The output of the gate 519 is connected to an enable input (EN) of a row decoder 520. The row decoder has a plurality of outputs for providing a plurality of inventive wordline sequences WLn ... WL0.

The controller further comprises a dummy bitline 521 coupled via a capacitor 523 to ground. A first end of the dummy bitline 521 is connected to the control input 507 of the flip-flop 505. A second end of the dummy bitline 521 (BL-DUM) is coupled to an output of a driver 525 (dummy bitline driver). The driver 525 further comprises an input (EN), to which the output of the flip-flop 505 is connected.

The controller of FIG. 5A comprises a first timing circuit and a second timing circuit. The first timing circuit comprises the flip-flop 505, the dummy bitline 521 and the capacitor 523. The first timing circuit may further comprise the driver 525. The second timing circuit comprises the ring oscillator 501 and the pulse generator 503. The second timing circuit may further comprise the row decoder 520. The pulse generator may be configured to determine a duration of the deactivation period.

According to another aspect of the invention, a dummy bitline can also be employed in order to provide an activation period which is proportional to the total access period. Therefore, the controller may comprise a dummy bitline coupled e.g. via a capacitor to ground for determining the duration of the same access operation during which e.g. a number of deactivation periods is provided, a duration of a deactivation period being determined using another dummy bitline coupled via another capacitor to ground, so that a discharge rate of the other capacitor determines the deactivation period.

Figure 5B:
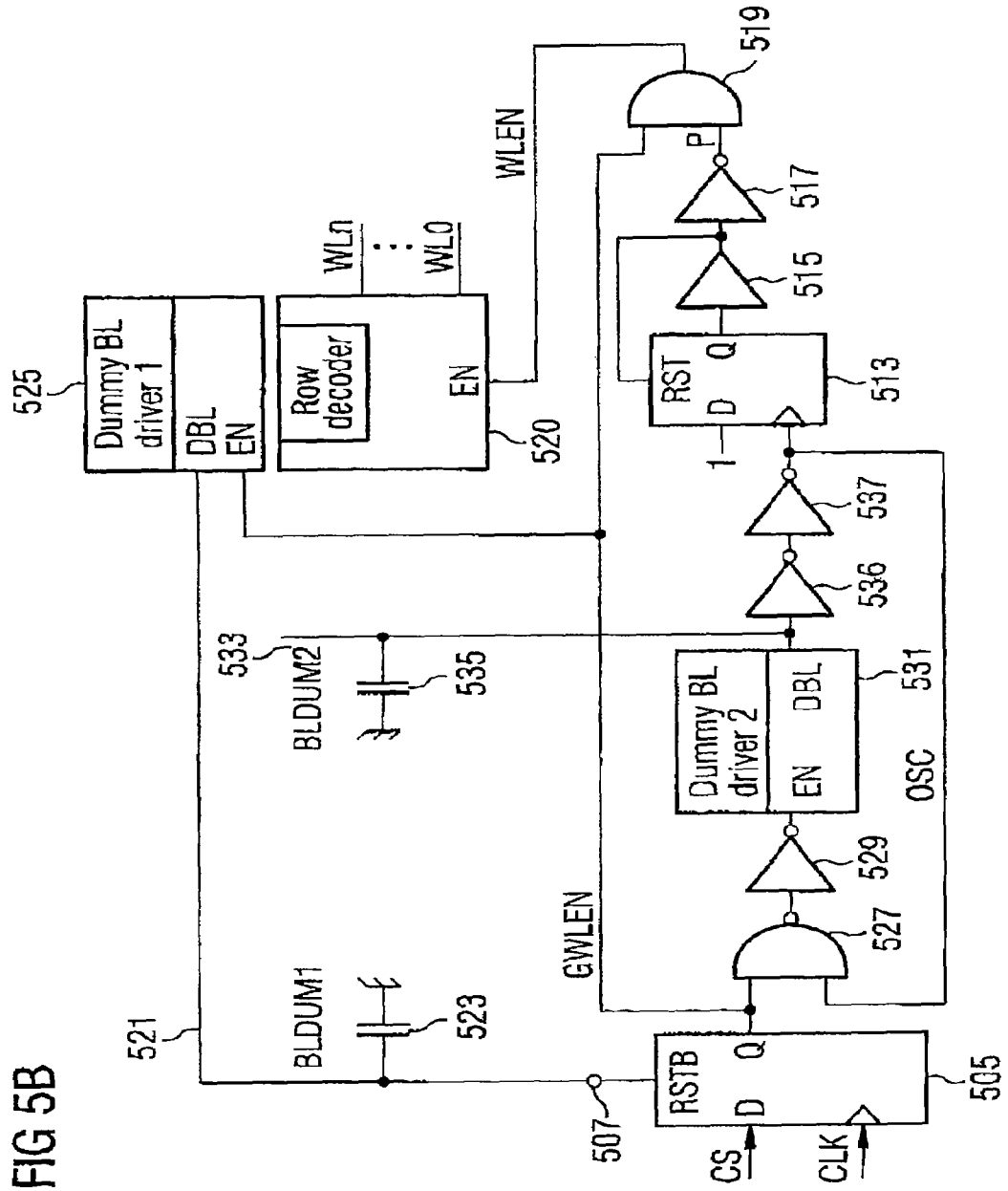
FIG. 5B shows a block diagram of a controller according to an embodiment of the invention.

FIG. 5B shows an embodiment of a controller according to an embodiment of the invention. Unlike the controller shown in FIG. 5A, the controller of FIG. 5B comprises an oscillator comprising a gate 527 having a first and a second input, the first input being coupled to the output of the flip-flop 505. The gate 527 may be a CMOS gate, e.g. a NAND gate. The oscillator further comprises a buffer 529, e.g. an inverter, coupled between an output of the gate 527 and a control input (EN) of a second driver 531, wherein the driver 525 forms the first driver. The oscillator further comprises a dummy bitline 533 (a second dummy bit line, wherein the dummy bitline 521 forms the first dummy bitline), the dummy bitline 533 being coupled via a capacitor 535 to ground. An output (DBL) of the second driver 531 is coupled to an end of the second dummy bitline 533. The other end of the second dummy bitline 533 may be floating, by way of example. However, the capacitor 535 may couple the other end of the second dummy bitline 533 to ground. The oscillator further comprises two buffers 536 and 537 coupled in series, wherein an output of the buffer 537 is coupled to the second input of the gate 527.

According to the embodiment of FIG. 5B, the capacitor 535 coupling the second dummy bitline 533 to ground is charged and discharged, wherein a resulting potential is provided to an input of the buffer 536 and via the buffer 537 to the second input of the gate 527. Since the output value of the buffer 537 is provided to the clock input of the flip-flop 513, charging and discharging the capacitor 535 has an impact on clocking the flip-flop 513, wherein a discharge time, e.g. a time interval during which a potential at the dummy bitline falls to a fraction of its value, or a charge time which is e.g. associated with the time interval which is required for charging the dummy bitline to raise back to the initial potential starting from the initial potential, directly determines the duration of an activation period. In one embodiment of the invention, the potential may drop to 50% of the initial value of the potential during the discharge time, and rise back, from 50% of the initial value to the initial value during the charge time.

Figure 6:
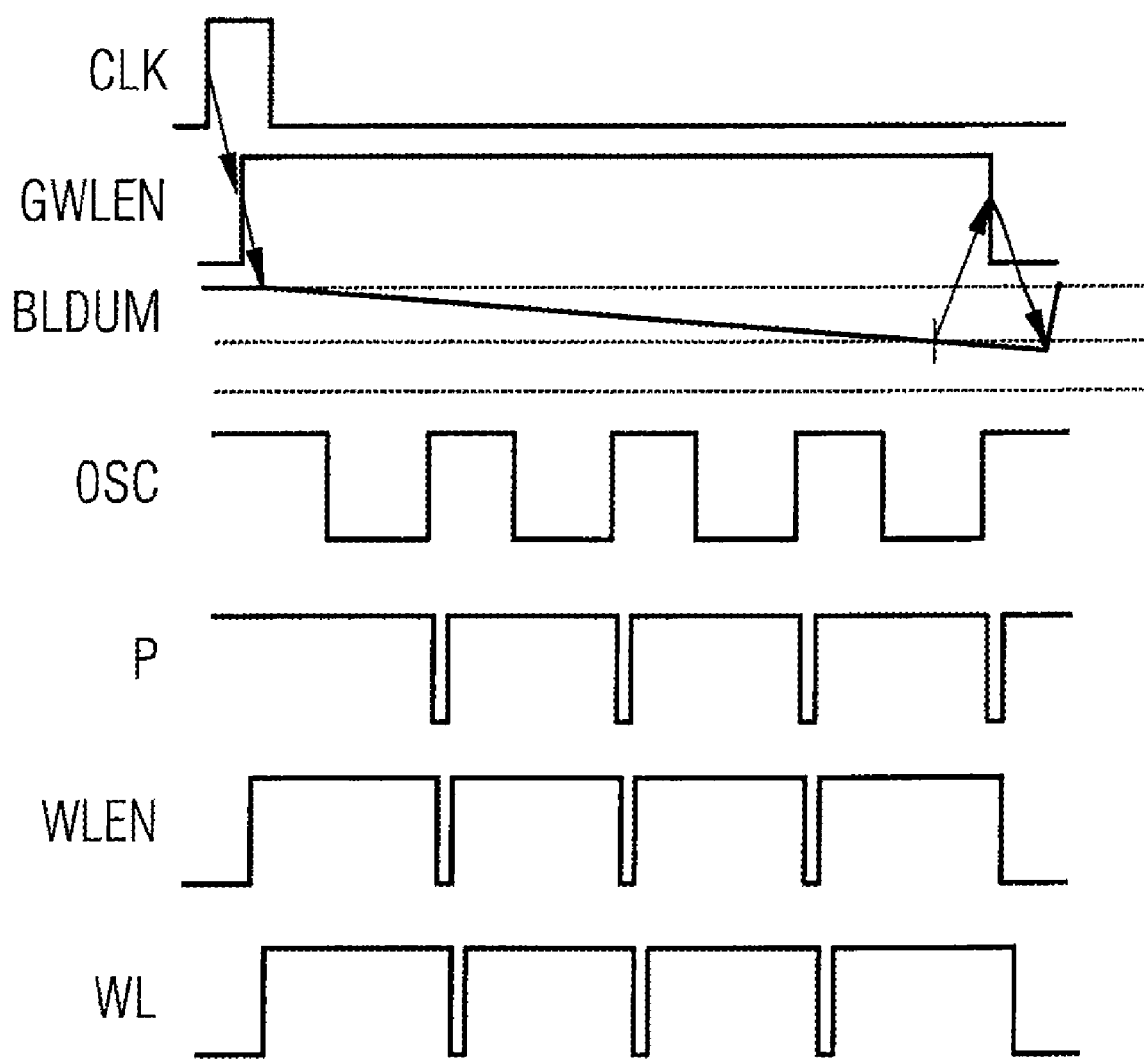
FIG. 6 shows a time diagram of signals associated with the controller of FIG. 5A.

FIG. 6 shows a signal diagram associated with the controller of FIG. 5A.

In response to e.g. a rising edge of a clock signal (CLK) applied to the clock input of the flip-flop 505, a signal GWLEN is provided via the output of the flip-flop 505. By way of example, an initial potential at the bitline 521 represented by the curve BLDUM in FIG. 6 is high. The signal at the output of the flip-flop 505 (GWLEN) may be provided to the enable input 525 (EN) of the driver 525. In response to GWLEN, the driver 525 is enabled so that the bitline 521 discharges via the capacitor 523, as indicated by the falling signal BLDUM in FIG. 6.

The signal GWLEN may be simultaneously provided to the second input of the gate 509 of the oscillator 501 so that at the output of the oscillator 501 an oscillating signal (OSC) is provided in order to clock the flip-flop 513 of the pulse generator 503. Since the output of the buffer 515 is coupled to the control input of the flip-flop 513, a pulsed signal P results at the output of the inverter 517. As shown in FIG. 6, the signal P comprises a plurality of pulses which may be separated by short deactivation periods. The signal P and the signal GWLEN may be provided to the gate 519 which provides, via the output, a signal WLEN enabling and disabling the row decoder 520. In response to WLEN, the row decoder 520 may provide e.g. a wordline sequence WL according to the invention, the wordline sequence comprising a plurality of activation periods and a plurality of deactivation periods, as shown in FIG. 6.

One embodiment of the invention provides e.g. an SRAM memory using a wordline signal as e.g. depicted in FIG. 6 with multiple cycles for each memory cycle. The inventive wordline signal may comprise a number of wordline pulses, wherein the duration and a duty factor may be controlled by the inventive controller 115 according to an SRAM cell stability characteristic. For example, in one embodiment, the duration of an activation period may be 3 ns, and the duration of a deactivation period may be 0.3 ns. In this case, the duty factor is 1 to 10 wherein the duration of the deactivation period depends on the cell characteristics, i.e. by a time interval which is required for cell recovery.

Correspondingly, each wordline cycle comprising an activation period and a deactivation period may have a duration of a low level phase (deactivation period) according to the SRAM cell recovery characteristics, as mentioned above. The duration of the high level phase (activation period) may be controlled according to the SRAM stability characteristics so that e.g. the duration of an activation period is shorter than a time interval associated with causing cell instability.

A number of wordline cycles may e.g. be controlled according to the read current of the SRAM cell. Furthermore, a global enable signal, e.g. GWLEN, of the wordline may be controlled by a first timing circuit. Correspondingly, a second enable signal of the wordline may be controlled by a second timing circuit generating a plurality of inactive phases (deactivation periods). The wordline may be enabled only when both said enable signals are active. As shown in FIG. 5A, the first enabling timing circuit may contain a dummy bitline.

The inventive concept may be applied to stabilizing memories ranking first in the low voltage risks. Furthermore, embodiments of the invention provide a memory periphery design which is able to stabilize the most instable bit cells. The invention further provides a solution to counter the SRAM cell instability at low voltage. It is simple to implement and recovers the major part of the yield loss.

FIG. 7 shows a memory cell according to a further embodiment of the invention. Unlike the memory cell shown in FIG. 1, the memory cell shown in FIG. 7 comprises a further switch 701 coupled between a further bitline 703 (BL_B) and the access node 105. The memory element further comprises another switch 705 coupled between the further access node 113 and another bitline 707 (BLB_B).

The memory cell further comprises a controller 709 having a first control terminal 711 coupled to the control terminal of the switch 103, a second control terminal 713 coupled to the control terminal of the switch 111, a third control terminal 715 coupled to a control terminal of the switch 701, and a fourth control terminal 717 coupled to a control terminal of the switch 705.

As shown in FIG. 7, the accessible memory element 107 may be accessed via the bitlines 101 ($BL_{13}$ A) and 109 (BLB_A) during an access operation. Furthermore, the accessible memory element 107 may be accessed to via the second pair of bitlines 703 ($BL_{13}$ B) and 707 (BLB_B). For example, the memory element 107 may be a core cell of a Dual-Port SRAM. The access operation can be performed via e.g. a port A, wherein the memory element 107 is accessed to via the bitlines 101 and 109 by e.g. simultaneously activating the switches 103 and 111 by applying the wordline signals WLA to the respective control terminals. Correspondingly, the accessible memory element 107 may be accessed to via a port B using the second pair of bitlines 703 and 707. The memory element 107 may be accessed to by activating the switches 701 and 705 by another wordline signal (WLB). It shall be noted that the switches 701 and 705 may be transistors, e.g. NMOS or PMOS field effect transistors.

For example, a strong access device accessing to the memory element 107 via the bitlines 101 and 109 (BL_A, BLB_A) may impact the potential at the node 105 (or/and at the node 113) due to a negative Vt variation −δVt across the switch 103. Furthermore, a weak access device accessing to the memory element 107 via the bitlines 703 and 707 may introduce a positive Vt variation +δVt due to a threshold voltage across the switch 701. In consequence, when both ports are selected at the same time, the node 105 (S) which may store a "0" is rising significantly because of the strong access device. Simultaneously, the weak access device of BL_B can be quasi shut off. According to the 90 nm technology, by way of example, at low voltage, a ratio between a read current of an access device in a single access (Isr) and a read current of the same access device in double access (Idr) can be greater than five. Therefore, the discharge of the bitline is much faster during a single read operation than during a dual read operation. If Idr is too low to ensure a reliable read sensing, then the single read can be reliable when the dual read is not functional.

In order to improve the dual read operation, a specific tuning of the bit cell or a technology change may be considered. For example, a re-tuning of the bit cell (memory element 107) may be performed by widening the pull-down device, and sometimes of the access device, where e.g. a gate area is widened. However, a bigger bit cell size and a higher leakage may result. According to the technology-oriented solution, e.g. a specific threshold Vt may be implanted to lower the Vt. However, higher manufacturing costs and higher leakage may result in this case.

Usually, Dual-Port SRAMs (DPSRAM) have both independent ports. For example, each port may have its own clock, wherein the memory is operating with asynchronous clocks. A worst case situation associated with a dual read access occurs when e.g. a read operation is enabled at the same time on both ports A and B. In this case, the wordline pulses may be identical since a read current of the bit cell (accessible memory element 107) is at its minimum and e.g. equal to Idr. If the both read operations start at different time instants, then the average read current on one port is a combination of Isr and Idr.

$$Ireadavg = k1*Isr + k2*Idr \text{ with } k1+k2=1 (0=<k1, k2=<1).$$

Then, Ireadavg is greater than Idr so that the read operation is more reliable.

In order to increase the average read current, both read operations, by way of example, may be shifted with respect to each other.

FIG. 8 demonstrates the inventive concept. In the upper diagram (FIG. 8) a wordline signal 801 (WLB) and a wordline signal 803 (WLA) are timely shifted with respect to each other. A potential 805 (S) at the access node 105 rises stepwise, so that e.g. a stable read out can be performed within the time interval during which only WLB is high (e.g. 0.7 volt).

The lower diagram of FIG. 8 shows the corresponding access current ($I_{13}$ passgate). As shown in FIG. 8, the access current (e.g. a read current) stabilizes at about 3 μA during which e.g. only port B is accessed to. If both ports are accessed to then the current value is only 0.3 μA. In FIG. 8, a high current ratio of 10 between Isr (3 μA) and Idr (0.3 μA) is shown, seen on the weak access transistor 701 of FIG. 7.

Figure 9:
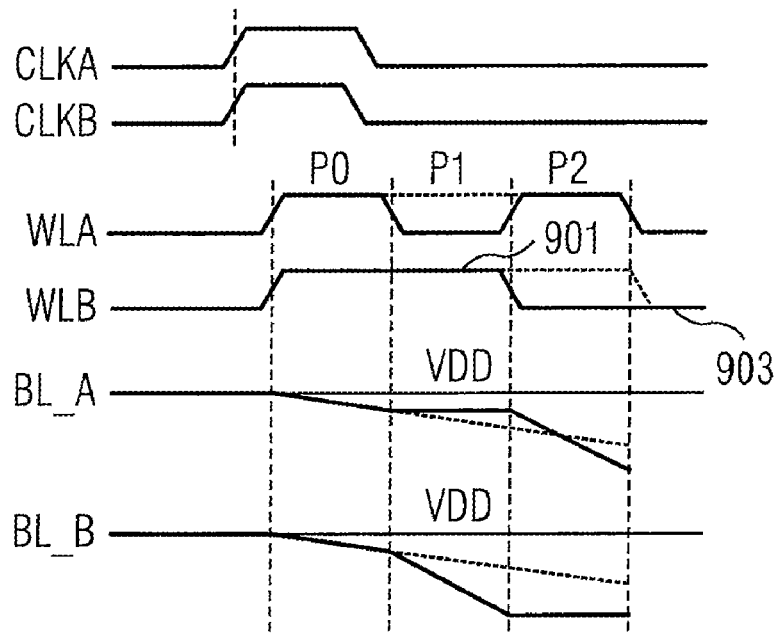
FIG. 9 shows a timing diagram according to an embodiment to the invention.

FIG. 9 shows a signal diagram associated with the memory cell of FIG. 7, wherein synchronous clock signals (CLKA and CLKB) for port A and port B are applied.

In order to activate the switches 103 and 111, the controller may be configured to generate the wordline sequence WLA comprising a first activation period P0, a deactivation period P1 and a second activation period P2. During the activation periods P0 and P2, the switches 103 and 111 are set to a conductive state so that the bitlines 101 and 109 are connected to the access nodes 105 and 113, respectively.

In order to activate the switches 701 and 705 for another access to the memory element 107, the controller 709 may be configured to generate a wordline sequence WLB simultaneously activating the switches 701 and 705. The wordline sequence WLB has a third activation period 901 and a deactivation period 903. As depicted in FIG. 9, the third activation period 901 at least partly overlaps the deactivation period P1, so that during the time interval determined by P1 only one device may access to the memory element via e.g. port B. Correspondingly, during the deactivation period 903, during which the switches 701 and 705 are switched off, the access to the memory element 107 is only possible via port A, since the corresponding switches 103 and 111 are activated.

FIG. 9 further shows the potential at e.g. the bitline 101 (BL_A) and the potential at e.g. the bitline 703 (BL_B). For sake of comparison, the dotted lines also shown in FIG. 9 depict signals and potentials associated with conventional approaches using a continuously high wordline signal during the same access operation.

Figure 10:
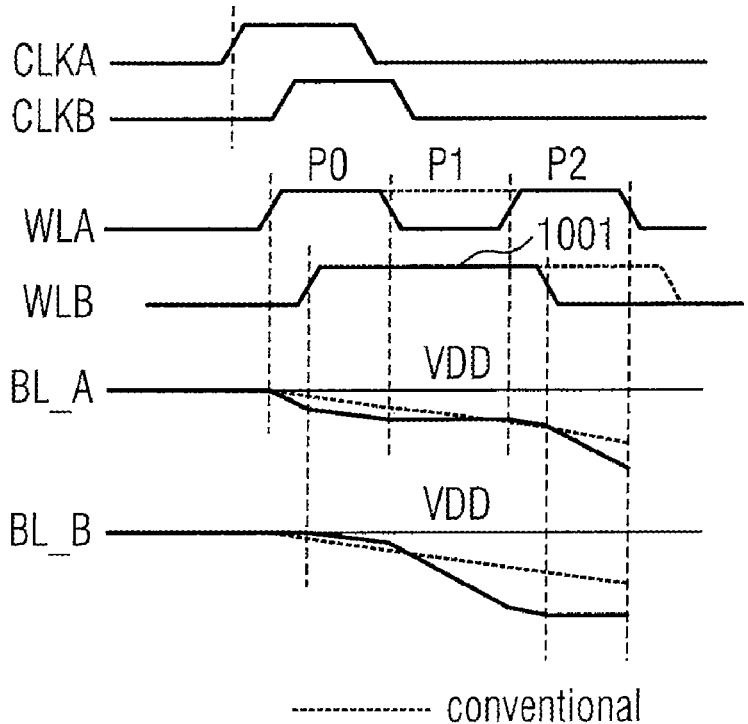
FIG. 10 shows a timing diagram according to an embodiment of the invention.

FIG. 10 shows signals and potentials associated with the memory cell of FIG. 7 for the case of asynchronous clocks CLKA and CLKB asynchronously determining a timing of signals generated by the controller 709.

As depicted in FIG. 10, the wordline signal WLB is shifted with respect to the wordline signal WLA towards the deactivation period P1 so that a third activation period 1001 of the wordline signal WLB begins later than the first activation period P0 and at least partly overlaps the activation periods P0, P2 and the deactivation period P1. As mentioned above, the controller may be configured to delay the wordline signal WLB with respect to the wordline signal WLA by delaying the clock signal CLKB with respect to the clock signal CLKA, by way of example. According to another embodiment, the controller 709 may be configured to directly delaying the wordline signal WLB with respect to the wordline signal WLA.

It shall be noted that the third activation periods 901 and 1001 may consist of concatenated activation sub-periods, each activation sub-period having a duration being equal to one of the periods P0, P2 or P1.

FIG. 10 also shows resulting potentials on bitlines BL_A and BL_B for the case of an asynchronous clocking.

The inventive timing diagrams of FIG. 9 and FIG. 10 show two wordline signals WLA and WLB at ports A and B which have different waveforms during e.g. a read operation in order to provide a significant non-overlap period (time), whatever the delay between both clocks is. According to an embodiment of the invention, the access operation may be split into three equal phases P0, P1 and P2. WLA is activated two times, wherein each pulse is half the WLB pulse width (⅓ of the operation). Correspondingly, WLB is activated one time, wherein the duration of the operation is ⅔. Accordingly, the current Ireadavg=0.33*Idr+0.33*Isr, whatever the clock shift may be.

Assuming Isr=5*Idr, Ireadavg=2*Idr, which means that the read current is doubled while the access time is maintained unchanged. This improvement can be used either to generate more read signals at the inputs of the sense amplifier or to reduce the access time if e.g. the read sensing is fine with Idr value.

The different waveforms of WLA and WLB lead to different waveforms also for the bitlines of both ports. However, at the end of the P2 phase, the read signal may be the same for both ports and greater than the read signal according to the conventional approach.

The further advantage of the inventive approach is the possibility to make port B faster by enabling the corresponding read sensing (i.e. by accessing to the memory element) at the end of phase P1. Then, the access times are different between the both ports but may correspond to a need at the chip level as the Dual-Port SRAM is often used as interface between two clock domains with different frequencies. It may be helpful to choose the faster port B for the faster clock domain.

According to an embodiment of the invention, a wordline activation may be divided in three phases (P0, P1, P2) for both wordlines of a Dual-Port SRAM, by way of example, in read operation. A dis-symmetric activation between wordline port A and wordline port B is possible. For example, the wordline of port A is activated two times during the phase P0 and P2. Correspondingly, the wordline of port B may be activate one time, during the phase P0 and P1. The read sensing may be enabled either at the end of P2 for both ports or at the end of P2 for port A and at the end of P1 for port B.

According to one embodiment, the control terminals of the switches 103 and 111 may be connected using a single wordline. In this case, the controllers 115 and 709 may have only one output connected to the wordline instead of two outputs 117, 119 and 711, 713 respectively. Correspondingly, the control terminal of the switches 701 and 705 may be connected by a further wordline so that the controller 709 has one further output replacing the outputs 715 and 717, which further output is connected to the further wordline for simultaneously activating the switches 701 and 705 by applying a wordline signal WLB to the further wordline.

For example, the phases P0, P1 and P2 may be timed by a dummy line that discharges e.g. three times per memory cycle (access cycle, access operation). The discharge event of the dummy bitline may be counted so that appropriate signals may be generated in order to enable either a continuous or discontinuous wordline.

The inventive timing of the word lines improves significantly the read operation at low voltage, either to become an increased amplitude of a read signal for yield improvement or to speed up the memory during the read access. The Dual-Port SRAM is often used as interface between two clock domains with different frequencies. The inventive concepts shown in detail for a Dual-Port SRAM can be applied to any type of Multi-Port SRAM memories.

FIG. 11 shows a controller comprising a cell timing circuitry with configurable wordline continuity according to an embodiment of the present invention.

The controller comprises a ring oscillator 1101 having an input and an output 1003. The ring oscillator 1101 further comprises a buffer 1105, e.g. an inverter, a gate 1107, e.g. a NOR-gate, a buffer 1109 and a buffer 1111. The buffers 1109 and 1111 may be inverters. The gate 1107 may be a CMOS gate. The output 1103 may be coupled via a capacitor 1113 to ground. Furthermore, the output 1103 may be coupled via a buffer 1115 to a clock input of a three state counter 1117 having a first output for providing a signal B0 and a second output for providing a signal B1.

The signal B1 is provided to an input of a pulse generator 1119, which may be triggered on a falling edge of B1. The pulse generator 1119 has an output for providing an end signal END to a control input of a flip-flop 1121, e.g. a RST flip-flop. The flip-flop 1121 has a clock input and a further input at which e.g. a CS signal (chip select) may be applied (e.g. a high signal).

The flip-flop 1121 has an output coupled to an input of the buffer 1105 of the ring oscillator 1101.

The signal B0 provided via the first output of the three state counter 1117 is provided to a further pulse generator 1123 which may be triggered on a falling edge of B0. The further pulse generator 1123 has an output for providing a signal ENDCWL.

The controller further comprises a further flip-flop 1125 having a clock input 1127, a further input 1129, a control input 1131 and an output 1133. As depicted in FIG. 11, a "1" corresponding to a high signal is applied to the further input 1129 of the flip-flop 1125. The clock input 1127 is configured to receive a signal GWLEN+NOT(CONT).B1. In this context, the symbol "+" represents a logical "or" and the symbol "." represents a logical "and" operation. The signal NOT (CONT) is, as depicted in FIG. 11, an inverted version of the signal CONT.

According to an embodiment of the invention, a signal END+CONT.ENDCWL+NOT(CONT).B0 is provided to the control input 1131 (RST). The flip-flop 1125 is configured to output a signal WLEN via the output 1133.

As depicted in FIG. 11, the output 1103 of the ring oscillator 1101 is coupled via a capacitor 1113 to ground. For example, a dummy bitline may be used for connecting the output 1103 to the capacitor 1113.

Figure 12:
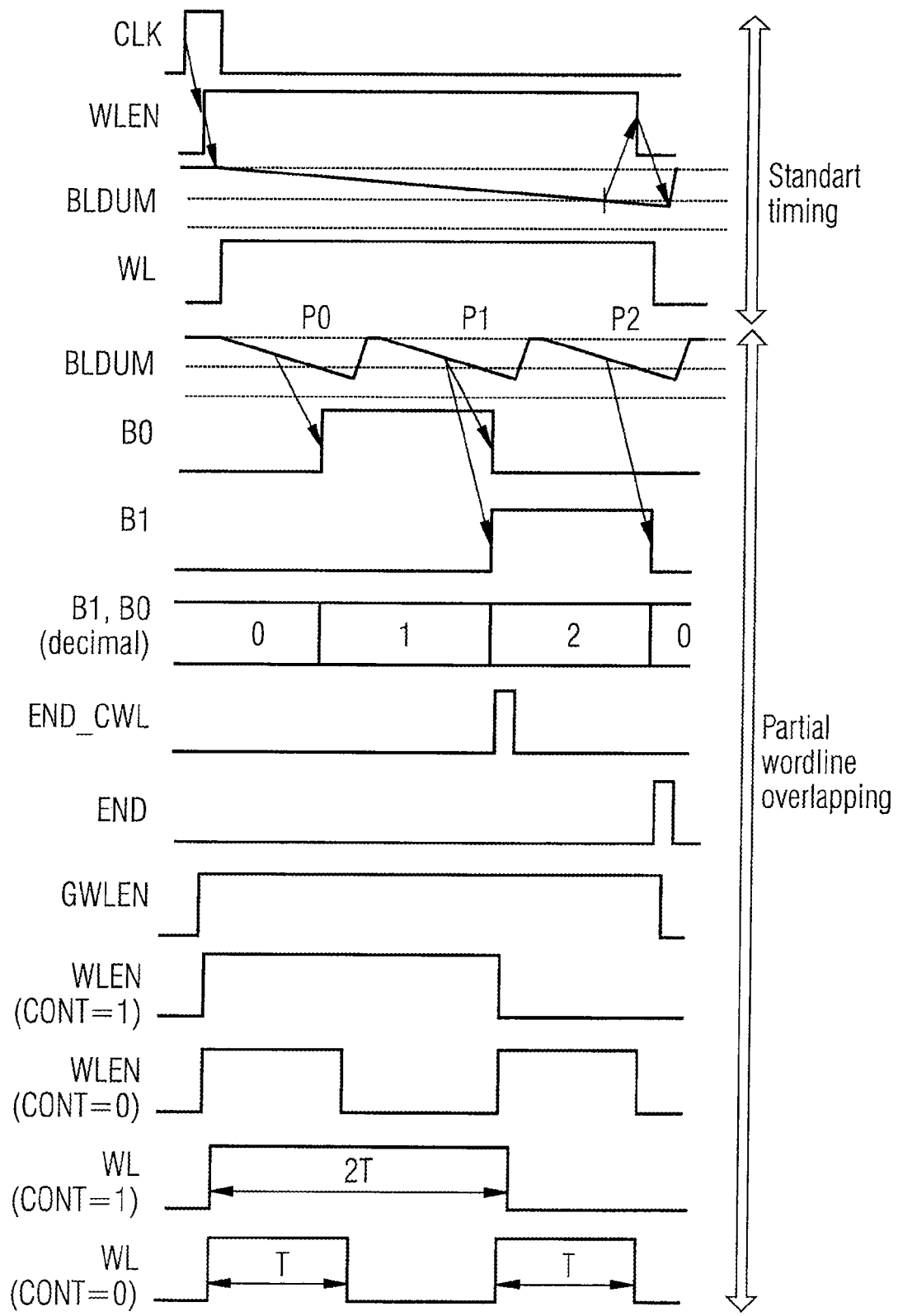
FIG. 12 shows signal diagrams associated with the controller of FIG. 11.

FIG. 12 shows a timing diagram associated with the controller of FIG. 11.

According to FIG. 12, both ports A and B of FIG. 7—using either the continuous or the discontinuous wordline—may be triggered by the same clock. Any dephasing between the clocks still maintains a minimum duration T where only one wordline of each port is active.

For sake of comparison, FIG. 12 shows in the upper portion diagrams associated with a standard timing, wherein the signals CLK, WLEN, BLDUM and WL are shown. BLDUM represents a falling potential due to discharging a capacitor.

FIG. 12 further demonstrates the inventive timing, e.g. self-timing, wherein a partial wordline signal overlapping is generated.

The signal BLDUM at the output 1103 of the ring oscillator 1101 comprises three phases P0, P1 and P2 resulting when charging and discharging the dummy bitline shown in FIG. 11. It shall be noted that the dummy bitline may be formed by a line connecting the output of the buffer 1109 and the input of the buffer 1111.

If e.g. the potential at the dummy bitline falls below a threshold, e.g. 50%, then the three state counter is activated so that B0 rises. The signal B1 is generated correspondingly so that, as shown in FIG. 12, e.g. a number of under-shootings of the threshold is counted (0, 1, 2, 0).

The pulse generator 1123 outputs the pulse END_CWL (ENDCWL), which signal is logically combined with the signal CONT using e.g. a gate and the result is provided to the flip-flop 1125. Correspondingly, the signal B1 triggers the pulse generator 1119 to output the pulse and END triggering the flip-flop 1121 to output the signal GWLEN. As depicted in FIG. 11, the signal GWLEN may logically be combined with NOT(CONT).B1, using e.g. an "AND" and an "OR" gate, and the result may be provided to the clock input 1127 of the flip-flop 1125.

In response to the signals at the clock input 1127 and at the control input 1131, the flip-flop 1125 generates either signal WLEN comprising e.g. the third activation period, when CONT=1, or generates an oscillating signal WLEN comprising a plurality of pulses representing the activation period, two subsequent pulses being separated by a deactivation period. Both wordline signals, one of them having an inactivation period of the length 2T, the other having two activation periods of the length T which are separated by a deactivation period, may be provided in order to activate the switches.

According to an embodiment of the invention, priority management may not be necessary. Currently, in single access, the read current of the weak path-gate may be several times bigger than in dual read (the node S is not disturbed by the strong path-gate). The current ratio frequently reaches 5 to 10. This problem is addressed by embodiments of the invention. Moreover, the dual access of the DPSRAMs will contain a phase with single access so that the invention can easily be applied in all DPSRAMs for the current and next technology.

Depending on certain implementation requirements, the inventive methods can be implemented in hardware or in software. The implementation can be performed using a digital storage medium, in particular a disc or a CD having electronically readable control signals which can cooperate with a programmable computer system such that the inventive methods are performed. Generally, the present invention is, therefore, a computer-program product with a program code stored on a machine-readable carrier, the program code being configured to perform the inventive methods when the computer program runs on a computer. In other words, the inventive methods are, therefore, a computer program having a program code for performing the inventive methods when the computer program runs on a computer.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   a bitline;
   an accessible memory element comprising an access node for accessing the accessible memory element during an access operation;
   an activable switch coupled between the bitline and the access node, the activable switch being configured to connect the bitline to the access node when activated and to disconnect the bitline from the access node when deactivated; and
   a controller configured to activate the activable switch within a first activation period, activate the activable switch within a second activation period, and deactivate the activable switch within at least one deactivation period, wherein the first activation period, the second activation period and the deactivation period are arranged within the same access operation.

2. The memory device according to claim 1, wherein the deactivation period is shorter than or equal to one of the first activation period and the second activation period.

3. The memory device according to claim 1, wherein the controller is configured to activate the activable switch during the first activation period, to deactivate the activable switch during the deactivation period, wherein the deactivation period follows the first activation period, and to activate the activable switch during the second activation period, wherein the second activation period follows the deactivation period.

4. The memory device according to claim 1, wherein the access operation is a read operation.

5. The memory device according to claim 4, wherein a potential at the access node represents a content of the accessible memory element, wherein the certain potential changes during the first activation period, wherein the controller is configured to deactivate the activable switch during the deactivation period, the deactivation period following the first activation period, and wherein a duration of the deactivation period is determined by recovery time required by a potential at the access node to return to the certain potential.

6. The memory device according to claim 1, wherein the controller is configured to activate the activable switch for a plurality of first activation periods, second activation periods, and deactivation periods during the access operation, wherein each deactivation period separates a first activation period from a second activation period, wherein a sum of the plurality of deactivation periods is less than a combined sum of the first activation periods and the second activation periods, the combined sum of the first activation periods and the second activation periods being determined by a degradation of an access current provided by the accessible memory element.

7. The memory device according to claim 1, wherein the controller comprises a dummy bitline and a capacitor coupled with the dummy bitline, wherein the controller is configured to determine a discharge time of the dummy bitline by discharging the dummy bitline via the capacitor, and to determine a duration of the access operation, and a number of first activation periods and second activation periods, the number being determined by the discharge time.

8. The memory device according to claim 1, wherein the controller (115) comprises a first timing circuit configured to determine a duration of the access operation and a second timing circuit configured to determine a number of deactivation periods during the same access operation.

9. The memory device according to claim 8, wherein the first timing circuit comprises a dummy bitline and a capacitor coupled to the dummy bitline, wherein the first timing circuit is configured to determine a duration of the access operation based on a discharge time of the capacitor.

10. The memory device according to claim 9, wherein a second timing circuit is configured to determine a duration of a deactivation period and is triggered by an output of the first timing circuit.

11. The memory device according to claim 10, wherein the second timing circuit is configured to determine a duration of an activation period.

12. The memory device according to claim 11, wherein the first timing circuit comprises a flip-flop, and the second timing circuit comprises a ring oscillator and a pulse generator, wherein an output of the flip-flop is coupled to an input of the ring oscillator, and the pulse generator is configured to determine the duration of the deactivation period.

13. The memory device according to claim 1, further comprising:
a further bitline; and
a further activable switch coupled between the further bitline and the access node of the accessible memory element, the further activable switch being configured to connect the further bitline to the access node when activated, or to disconnect the further bitline from the access node when deactivated,
wherein the controller is configured to activate the further activable switch within a third activation period when accessing the memory element during a further access operation, the third activation period at least partly overlapping the deactivation period of the activable switch.

14. The memory device according to claim 13, wherein the controller is configured to deactivate the further activable switch during a further deactivation period while accessing the accessible memory element during the same further access operation, the further deactivation period at least partly overlapping one of the first and the second activation period of the activable switch.

15. The memory device according to claim 14, wherein the first activation period, the second activation period, the third activation period, the deactivation period and the further deactivation period are equal.

16. The memory device according to claim 13, wherein the controller further comprises an access detector configured to detect the further access operation and to delay a begining of the third activation period until a point in time at or near the deactivation period of the activable switch.

17. The memory device according to claim 13, wherein the controller further comprises a counter and a timing circuit, the counter comprising a dummy bitline and a capacitor coupled to the dummy bitline, wherein a duration of an output value provided by the counter is determined by a discharge time of the capacitor, the timing circuit being controlled by the output value to determine at least one of the first activation period, the second activation period, the third activation period and the deactivation period.

18. The memory device according to claim 17, wherein the counter comprises a ring oscillator and a three state counter, wherein the ring oscillator is configured to provide an oscillating sequence to charge or to discharge the capacitor, and a potential at the capacitor is provided to the three state counter, the three state counter being configured to generate the output value in response to the potential at the capacitor.

19. The memory device according to claim 18, comprising another activable switch coupled between another bitline and another access node of the accessible memory element, the another activable switch being configured to connect the another bitline to the another access node when activated, or to disconnect the another bitline from the another access node when deactivated, wherein the controller is configured to simultaneously activate or deactivate the activable switch and the another activable switch.

20. The memory device according to claims 1, wherein the accessible memory element is one of a random access memory element and a static random access memory element.

21. A method for controlling a memory device, the memory device comprising a bitline, an accessible memory element having an access node for accessing the accessible memory element during an access operation, and an activable switch coupled between the bitline and the access node, the activable switch being configured to connect the bitline to the access node when activated, or to disconnect the bitline from the access node when deactivated, the method comprising:
activating the activable switch within a first activation period;
activating the activable switch within a second activation period; and
deactivating the activable switch within at least one deactivation period,
wherein the first activation period, the second activation period and the deactivation period are arranged within the same access operation.

22. A computer readable storage medium comprising a program for controlling a memory device comprising a bitline, an accessible memory element having an access node for accessing the accessible memory element during an access operation, and an activable switch coupled between the bitline and the access node, the activable switch being configured to connect the bitline to the access node when activated, or to disconnect the bitline from the access node when deactivated, which, when executed, performs an operation comprising:

activating the activable switch within a first activation period;

activating the activable switch within a second activation period; and deactivating the activable switch within at least one deactivation period, wherein the first activation period, the second activation period and the deactivation period are arranged within the same access operation.

\* \* \* \* \*